United States Patent
Goodson et al.

[19]

[11] Patent Number: 5,809,085
[45] Date of Patent: Sep. 15, 1998

[54] APPARATUS AND METHOD FOR DETECTING AND DISCRIMINATING VARIOUS SIGNAL TYPES IN THE PRESENCE OF IMPULSE DISTORTIONS

[75] Inventors: Richard L. Goodson, Huntsville; Mickey C. Rushing, Harvest; Gary D. Hunt, Gurley; Lee T. Gusler, Jr., Huntsville, all of Ala.

[73] Assignee: Motorola Inc., Schaumburg, Ill.

[21] Appl. No.: 496,048

[22] Filed: Jun. 28, 1995

[51] Int. Cl.$^6$ .................................................. H03D 1/02
[52] U.S. Cl. ........................ 375/320; 375/340; 455/308; 455/334; 379/93.34
[58] Field of Search .................................... 375/320, 316, 375/268, 259, 340, 345, 346, 324, 325, 377, 224; 329/347, 349, 351, 353, 371, 350; 455/296, 307, 312, 334, 337, 338, 339, 308, 309; 379/3, 93.34, 406, 410

[56] References Cited

U.S. PATENT DOCUMENTS

| | | | |
|---|---|---|---|
| 4,042,883 | 8/1977 | Rae | 325/477 |
| 4,405,837 | 9/1983 | Ecklund | 179/1 |
| 4,931,250 | 6/1990 | Greszczuk | 375/8 |
| 5,311,578 | 5/1994 | Bremer et al. | 379/97 |
| 5,349,635 | 9/1994 | Scott | 379/97 |
| 5,446,771 | 8/1995 | Lin | 375/224 |

*Primary Examiner*—Chi H. Pham
*Assistant Examiner*—William Luther
*Attorney, Agent, or Firm*—Nancy R. Gamburd; John W. Powell

[57] ABSTRACT

An apparatus and method are provided for a data communications device, such as a modem (100, 101) or facsimile machine, to detect and discriminate various amplitude modulated signals, such as an ANS signal of the ITU V.25 protocol and an ANSam signal of the ITU V.8 protocol, which may be subject to impulse distortions (FIG. 5B). The apparatus and method embodiments band pass filter (204) an incoming signal at a first frequency, and dynamically limit (208) any impulse distortions of the incoming signal to a limit threshold (211). The limit thresholds may be dynamically determined by rectifying (209) and low pass filtering (210) the band pass filtered signal to determine a low frequency average magnitude level of the incoming signal, with the limit thresholds set as a predetermined variance from this low frequency average magnitude level. The various frequency components of the amplitude modulated signal may then be discriminated by rectifying (215) and band pass filtering (217) at a second frequency, such as the frequency of the amplitude modulating component. Various detectors (205, 206) then determine the type of information present in the incoming signal, such as whether the signal is an ANS signal or an ANSam signal.

30 Claims, 4 Drawing Sheets

APPARATUS AND METHOD FOR DETECTING AND DISCRIMINATING VARIOUS SIGNAL TYPES IN THE PRESENCE OF IMPULSE DISTORTIONS

FIELD OF THE INVENTION

This invention relates in general to data communications devices, and more specifically, to an apparatus and method for determining certain characteristics of received signals.

BACKGROUND OF THE INVENTION

Data communications equipment ("DCE") such as modems and facsimile machines presently use a signal referred to as answer-back tone ("ANS") to disable any echo suppressers or echo cancellers present on the general (or public) switched telephone network (GSTN). The ANS signal is specified in ITU Recommendation V.25 to consist of a 2100 Hertz sine wave with 180 degree phase reversals every 450 msec (±25 msec). The ANS signal has been successfully used for many years by both manual and automatic answering DCEs.

A new signal known as an amplitude-modulated answer-back tone ("ANSam") has recently been specified by ITU Recommendation V.8. This signal is meant both to appear as an ANS signal to the GSTN network and also to identify the answering station as a V.8 capable device. The ANSam signal consists of the ANS signal amplitude modulated ("AM" or "am") by a sine wave at 15 Hertz with a modulation index of 20 percent. Preferrably, the calling DCE should be able to detect the ANSam and to distinguish it from ANS at low signal to noise ratios (6 dB SNR), low receive levels (−43 dBm), and other transient variations and distortions generated by the network equipment.

A prior art or more classical approach to detecting an ANSam-type signal is to filter the signal with a narrow band filter, rectify the filtered signal to recover the amplitude modulation aspect of the ANSam-type signal, and then apply the filtered and rectified signal to a 15 Hz AM detector. The phase reversals of the ANS and ANSam signals, however, typically appear to the system as impulse distortions (or a superposition of impulse distortions on the signal); such impulse distortions typically cause an impulse response in the system and, for example, causes ringing and overshoot in the filters used to detect the signal, especially because of the narrow bandwidths of the filters needed to detect the signal. This ringing tends to appear to the detector as severe noise, may have a long time constant to return to a normal steady state, and also significantly increases the likelihood of false detection of an ANSam signal.

Another prior art approach to detecting an ANSam-type signal has also employed the filtering and rectification of the ANSam-type signal, but has also attempted to avoid the effects of the impulse distortions by synchronizing to the phase reversals and only detecting the signal between these reversals. This approach of synchronizing to the phase reversals, however, tends to cause discontinuities in the received signal or data and may itself create a step response in the detector, which also reduces noise immunity, increases response time, and increases the likelihood of false detection. Furthermore, this prior art approach does not address the non-periodic transients which may be applied to the system by the network and which may also appear as random impulse distortions.

Another previous approach has been to attempt to detect an ANSam-type signal in the frequency domain by performing a Discrete Fourier Transform (DFT) or by using sharp tone filters. These frequency domain approaches have tended to be considerably more complex, requiring many samples for the DFT, plus windowing to reduce sidebands. In addition, these frequency domain approaches have also tended to be severely impacted by the phase reversals and require a much longer response time due to the narrow bandwidths required to distinguish ANSam from ANS.

Accordingly, a need has remained to reliably detect amplitude modulated signals in the presence of impulse distortions, such as the detection of ANSam, to avoid false detections, and to reliably distinguish signals such as ANSam from ANS. In addition, a need has remained to perform such detection efficiently, with minimal complexity and with a minimal response time, with high noise immunity, and with equipment having a lower or reduced cost to manufacture or purchase.

DETAILED DESCRIPTION OF THE INVENTION

Figure 1:
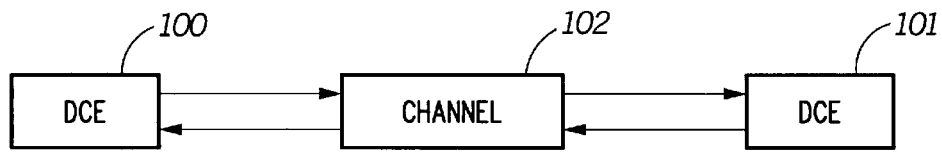
FIG. 1 is a block diagram illustrating modems connected to each other via a channel, for full duplex data transmission and reception.

FIG. 1 illustrates a first DCE 100, such as a first modem or first facsimile device, connected to a second DCE 101, such as a second modem or second facsimile device, via a channel 102, such as the general (or public) switched telephone network ("GSTN"). The modems or other devices may operate in full-duplex, such that each may transmit data and receive data at the same time. In order to establish a communications link and to compensate for various distortions, impairments, and modifications which may exist in the channel or which may otherwise occur during data transmission, various protocols and standards have evolved, such as the International Telecommunication Union (ITU) Recommendation V.8, V.25, and the recent V.34, involving the use of a variety of signals, such as probe signals, the answer back tone signal, and the amplitude modulated answer back tone signal. Under these various protocols, each of these defined signals has predetermined, defined characteristics, and are transmitted from each DCE (as sender) to the other DCE (as receiver), during the initial communication period (training period) in which the two devices train with each other.

As mentioned above, the ANS signal is the answer back tone signal, defined in ITU Recommendation V.25 as a 2100 Hz sine wave having abrupt, 180 degree phase reversals every 450 milliseconds. The amplitude modulated answer back tone, known as ANSam, also consists of a 2100 Hz sine wave with abrupt, 180 degree phase reversals every 450 milliseconds, which is also amplitude modulated with a 15 Hertz sine wave at a modulation index of 20 percent, as defined by ITU Recommendation V.8. Also as mentioned above, the ANS signal is used to disable any echo suppressors or echo cancellers which may be present in the channel 102 (FIG. 1). The ANSam signal similarly provides these functions, but also utilizes the 15 Hz amplitude modulation ("AM" or "am") to identify the answering or receiving DCE, such as DCE 101 (FIG. 1), as a V.8 capable device.

As discussed in more detail below, the present invention concerns the detection of amplitude modulated signals, such as ANSam, in the presence of impulse distortions. Such impulse distortions may occur, for example, due to the phase reversals of the ANS and ANSam signals, or may occur due to noise or interference. The various method and apparatus embodiments of the present invention provide a mechanism to both quickly and reliably detect and distinguish (or discriminate) between the ANS and ANSam signals with a high degree of confidence, at low signal to noise ratios, and at low power levels. The invention applies a non-linear technique of filtering the signal specifically to remove the impulse distortions generated by the phase reversals or other transient impulse distortions present in the GSTN environment. The invention advantageously utilizes the characteristics of such signals, and uses a dynamic, soft limiter approach to dynamically reduce impulse distortions at varying power and amplitude levels.

Figure 2:
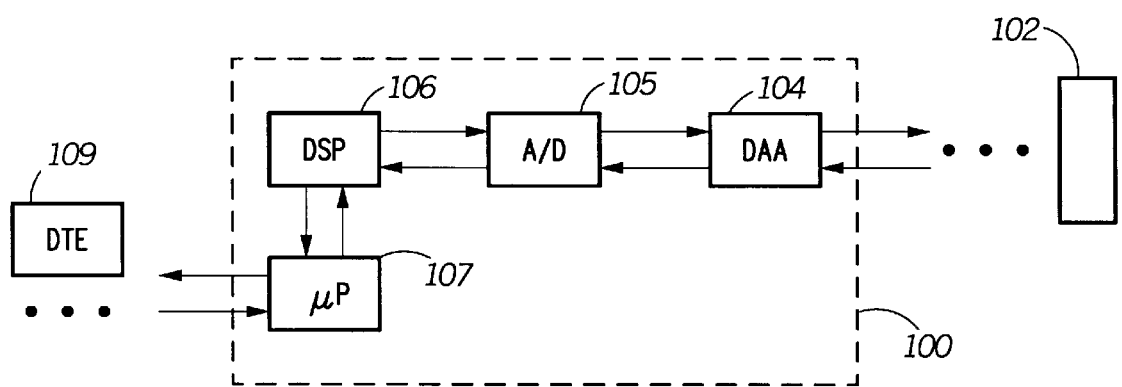
FIG. 2 is a block diagram illustrating a first embodiment of a modem or other DCE in accordance with the present invention.

FIG. 2 is a block diagram illustrating a first embodiment of a modem or other DCE in accordance with the present invention. As shown in FIG. 2, a modem 100 is coupleable to a DTE 109, such as a computer, and coupleable to a channel 102, for data transmission and reception. Within the modem, a data access arrangement 104 known as a "DAA" may receive an analog signal transmitted on the channel 102. DAAs are known in the prior art and may be made of a variety of discrete components, including analog multiplexers, resistors, capacitors, and operational amplifiers, or may be embodied in whole or part as an integrated circuit, and performs such functions as impedance matching and power level adjustment. Typically connected to the DAA 104 is a analog-to-digital and digital-to-analog converter 105, referred to herein as an analog-digital ("A/D") converter, such as an SGS Thompson ST 7544 or ST 7545, which converts an analog signal received from the channel 102 to digital form, and converts digital information to analog form for transmission over the channel 102. The A/D converter 105 is then connected to a digital signal processor ("DSP") 106, such as a Motorola M56002. The DSP is used in a first embodiment of the invention herein, performing the various functions described in detail below. The DSP 106 is connected to a microprocessor 107, such as a Motorola M68302, which may be coupled to a DTE 109 to transmit and receive digital information.

Figure 3:
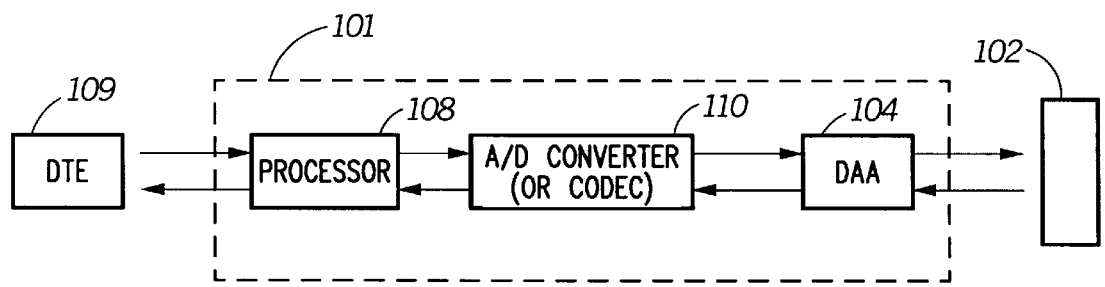
FIG. 3 is a block diagram illustrating a second embodiment of a modem or other DCE in accordance with the present invention.

FIG. 3 is a block diagram illustrating a second embodiment of a modem or other DCE in accordance with the present invention. Referring to FIG. 3, the DAA 104 performs the same functions, has the identical components, and is similarly connected as previously discussed with reference to FIG. 2. As in the modem 100 of FIG. 2, in the modem 101 of FIG. 3, an A/D converter (or, equivalently, a coder-decoder ("codec")) 110 to convert analog signals to digital, sampled signals, and to convert digital, sampled signals to analog signals. In contrast with the modem 100 of FIG. 2, however, FIG. 3 illustrates a processor 108, such as a Motorola M68356, which performs the functions of both the DSP 106 and the microprocessor 107 of FIG. 2. The processor 108 is utilized in a second embodiment of the invention herein, also performing the various functions described in detail below. The processor 108 may also be coupled to a DTE 109 to transmit and receive digital information. As a consequence of the interchangeability of a DSP with a processor in these various embodiments, the terms DSP, processor (or microprocessor) are used interchangeably and inclusively herein, such that use of one term may be interpreted to mean and include the various other processor embodiments.

Figure 4:
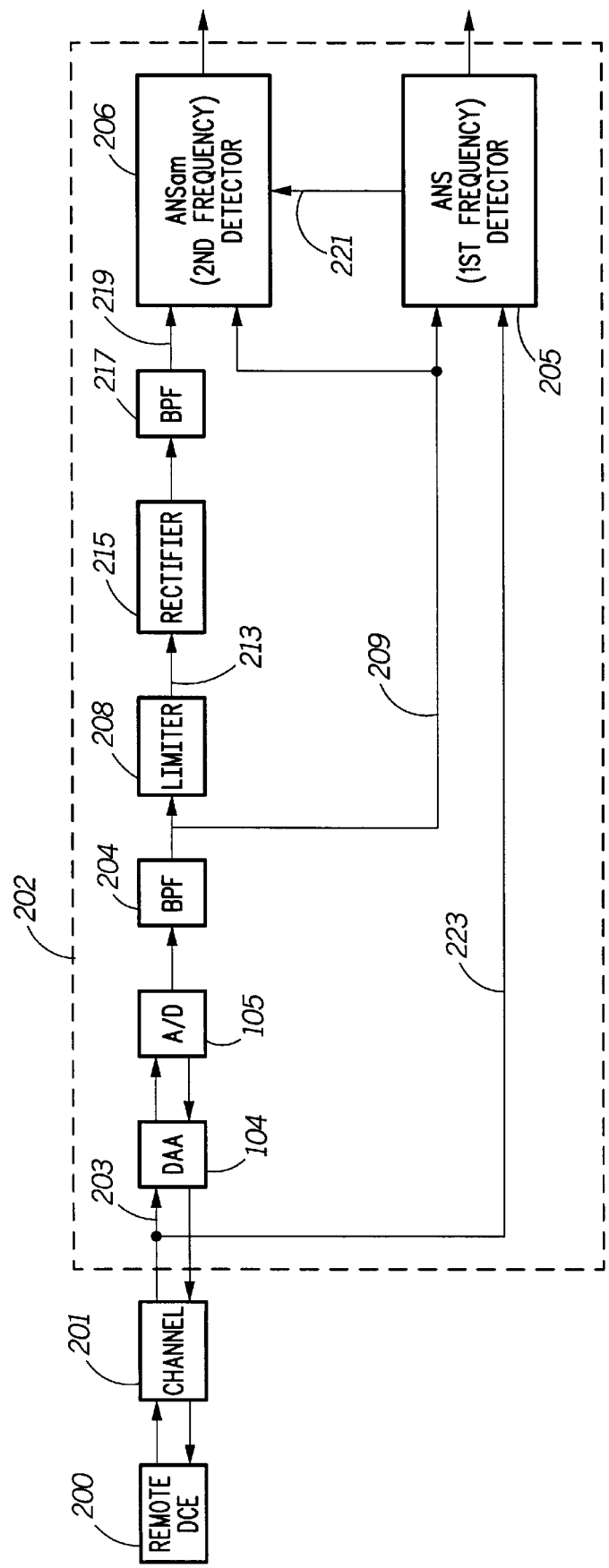
FIG. 4 is a block diagram illustrating the functional components of an embodiment of the present invention.
Figure 5A:
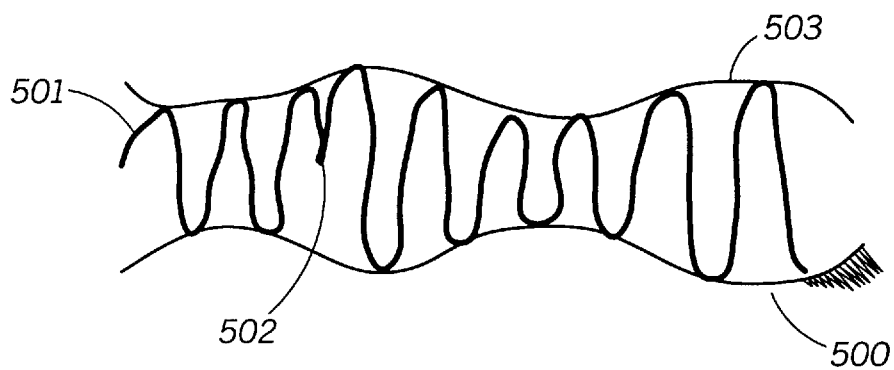
FIG. 5A is a graph illustrating a representation of ANSam signal (not to scale).

FIG. 4 is a block diagram illustrating the functional components or blocks of an embodiment of the present invention. Referring to FIG. 4, a remote DCE 200, such as a modem or facsimile device, may transmit an ANS signal or an ANSam signal over the channel 201 to the local (or receiving) DCE 202 via an incoming link or line 203. As discussed above, connected to the channel 201 is a DAA 104, which in turn is connected to an A/D converter 105. A representation of an ANSam signal, which may be transmitted over the channel 201 and appearing on the incoming line 203, is depicted in FIG. 5A. The ANSam signal 500 consists of a 2100 Hz signal (or portion of a signal) 501 having phase reversals 502 every 450 ms, with amplitude modulation with a 15 Hz signal (or portion of a signal) 503 having a modulation index of twenty percent. As used herein, a signal to be modulated, such as the 2100 Hz portion of the ANSam or ANS signals, is referred to as a first frequency component. Also as used herein, the modulating signal, such as the 15 Hz signal 503, is referred to as a second frequency component or a second frequency envelope component. As used herein, an ANS signal is also considered to be an amplitude modulated signal having, however, a zero percent (0%) modulation index.

Referring to FIG. 4, an incoming signal, such as an ANSam signal, is received by the local DCE 202 on incoming line 203, is level adjusted and so on by the DAA 104, is sampled by the A/D converter 105, and is transmitted or input to a band pass filter ("BPF") 204. The incoming signal appearing on line 203 consists of a transmitted signal (from the remote DCE 200), such as an ANSam or ANS signal, plus any distortions from the channel, plus any applied impulse distortions typically generated by the phase reversals. The incoming signal appearing on line 203 will have an average power level, referred to herein as the first average power level or as the amplitude modulated signal average power level. If the incoming signal is an ANS signal, the first average power level is also referred to herein as a answer back tone signal average power level. If the incoming signal is an ANSam signal, the first average power level is also referred to herein as an amplitude modulated answer back tone signal average power level. This incoming signal is applied to a BPF 204 to remove undesired signals, such as noise, and to determine whether the incoming signal on line 203 contains a 2100 Hz component or other first frequency component, which would indicate that the incoming signal is an ANS or an ANSam signal, for subsequent use in the ANS detector 205 and the ANSam detector 206. In the preferred embodiment, the BPF 204 has a center frequency of 2100 Hz, with a bandwidth of 50 Hz (frequency range of 2075 Hz to 2125 Hz), to detect the presence of either an ANS or ANSam signal, and is designed to remove as much undesired signal as possible yet maintain an acceptable response time, as the impulse distortions tend to cause the output signal of the BPF 204, appearing on line 207, to overshoot and ring. The narrower the frequency range of the BPF, the more overshoot and ringing will be generated by an impulse, and the longer the settling time. The wider the frequency range of the BPF, the faster the response time, but the amount of false signal discrimination may be reduced.

Figure 5B:
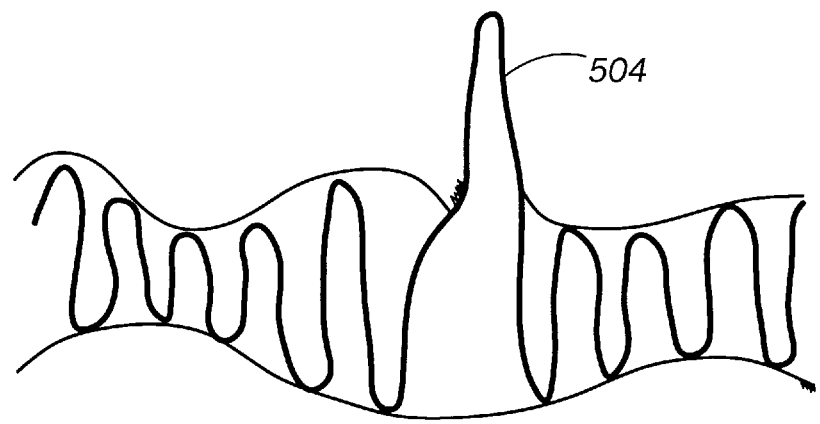
FIG. 5B is a graph illustrating a representation of a signal resulting from band pass filtering of an ANSam signal (not to scale).

The output of the BPF 204, appearing on line 207, referred to as a first band pass filtered signal, is represented in FIG. 5B (not drawn to scale), and will have an average power level referred to as the first band pass filtered signal average power level or occasionally as the second average power level. FIG. 5B illustrates a 2100 Hz signal (first frequency component) 501, a 15 Hz modulating signal (second frequency envelope component) 503, and an impulse (or impulse response) 504. Referring again to FIG. 4, the first band pass filtered signal, output from the BPF 204 and appearing on line 207, is input to the dynamic soft limiter 208, and is also input on line 209 to the ANS detector (or first frequency detector) 205 and the ANSam detector (or second frequency detector) 206. The dynamic soft limiter (or dynamic soft limit component) 208, as discussed in detail below, will dynamically remove and smooth any impulse distortions appearing in the first band pass filtered signal, under varying conditions such as varying power levels, based upon both the current low frequency average magnitude level (or dc average level) of the first band pass filtered signal, and upon the range of possible modulation indices of the modulating signal 503, such as the 20% modulation index of the ANSam signal. The dynamic soft limiter 208 reduces the impulse response of the various band pass filters utilized in the invention, reduces the propagation of these impulses throughout the system, and does so without a significant increase in response time.

Figure 6:
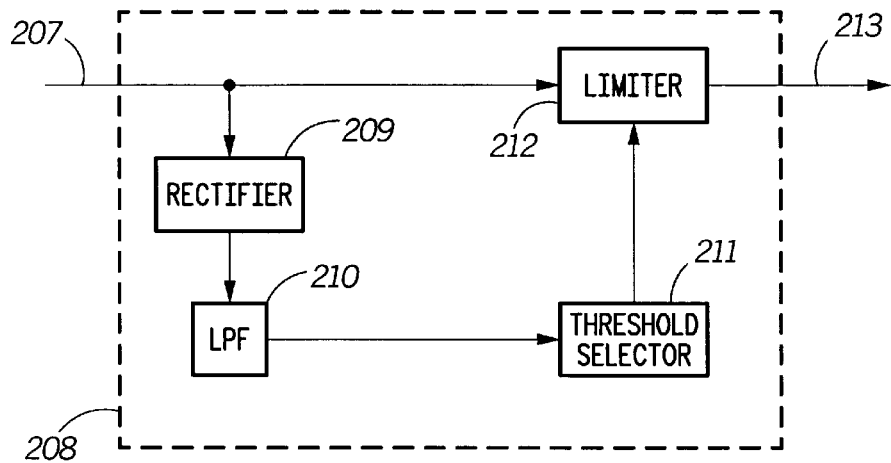
FIG. 6 is a block diagram illustrating the dynamic soft limit component of an embodiment of the present invention.

FIG. 6 is a block diagram illustrating the dynamic soft limit component (or dynamic soft limiter) 208 of an embodiment of the present invention. The first band pass filtered signal is transmitted on line 207 to a rectifier 209 and to a limiter 212. The rectifier 207 rectifies the first band pass filtered signal, and the rectified output (from rectifier 207) is transmitted to the low pass filter ("LPF") 210, to determine the average magnitude (of the amplitude) of the first band pass filtered signal (or, equivaltently, of the incoming signal). To avoid confusion, whenever an average amplitude level is referred to, it should be understood to mean the average magnitude (absolute value) of the particular amplitude. This average magnitude level of the signal output from the LPF 210 may be largely a dc (direct current) and low frequency average level, especially in the preferred embodiment, in which the LPF may have a cut-off frequency as low as 8–10 Hz. This average magnitude level is referred to as the low frequency average magnitude level (or, equivalently, as the low frequency average power level). This rectified, low pass filtered signal is input or applied to block 211, which determines limit thresholds, preferrably as a predetermined variance from the low frequency average magnitude level. The limit thresholds are calculated or determined based upon the modulation index of the incoming signal, the low frequency average magnitude level, and an empirically determined margin of tolerance. In the preferred embodiment, used to detect and distinguish ANSam and ANS signals, with the ANSam signal having a 20% modulation index and the ANS signal having a 0% modulation index (i.e., no modulation), the threshold limits are set at 25% above the low frequency average magnitude level (for both positive and negative polarities). These threshold limits are then applied to the limiter 212.

Figure 5C:
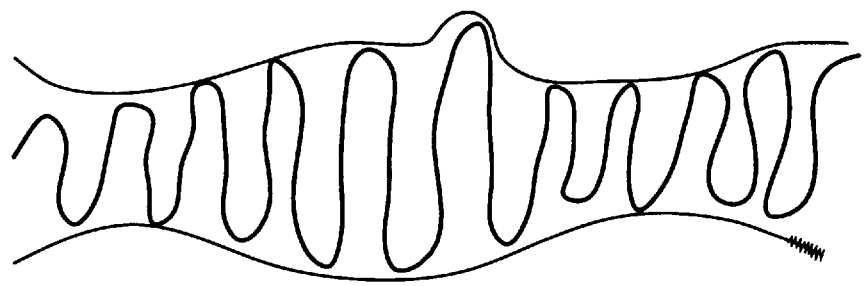
FIG. 5C is a graph illustrating a representation of a limited signal (not to scale) in accordance with the present invention.

As shown in FIG. 6, the limiter 212 receives the first band pass filtered signal on line 207. The limiter 212 clips or limits the amplitude of the first band pass filtered signal, to have a magnitude (absolute value) which does not exceed the limits determined by the limit thresholds, block 211, to form a limited signal appearing on line 213. For example, in the preferred embodiment, with threshold limits set at 25% above the low frequency average magnitude level, the magnitude of the amplitude of the limited signal may not be greater than approximately 25% above the maximum amplitude of the first band pass filtered signal. More precisely, the magnitude of the limited signal may not be greater than (1.25)A where "A" is the low frequency average magnitude level (for both positive and negative polarities). Because the threshold limits are directly related to the average magnitude or power level of the incoming signal (as determined by the low frequency average magnitude level), the limiter 212 of the dynamic soft limiter 208 generates a rather smooth limited signal, with a limited signal illustrated as, for example, the signal shown in FIG. 5C. The dynamic soft limiter 208 also provides for limit thresholds which are immediately variable, as the limit thresholds are directly related to the current magnitude (or, equivalently, power) of the incoming signal, providing for a dynamic response to differing power levels of incoming signals and a substantial dynamic range, providing an appropriately limited signal throughout the 0 dBm to –43 dBm range.

Referring again to FIG. 4, the limited signal on line 213 is then applied to a rectifier 215, in order to detect or recover a second frequency (envelope) component of the incoming signal, if any. The rectified, limited signal is then transmitted or applied to a narrow bandwidth, second band pass filter ("BPF") 217 having a center frequency at the expected frequency of the second frequency component of the incoming signal, to provide an output signal on line 219. The output signal on line 219 will have an average power level, referred to herein as the filtered limited signal average power level. In the preferred embodiment, to discriminate the 15 Hz modulating component of the ANSam signal, a narrow bandwidth second BPF (having a 15 Hz center frequency) is used, which attenuates relatively all signals other than a 15 Hz modulating component, and improves the quality of the output signal on line 219 in the presence of noise and other distortions. Because the second BPF 217 is designed to discriminate a very low frequency, 15 Hz signal, it has a narrow bandwidth, and therefore has a relatively slow settling time and a relatively long impulse response. Therefore, if the dynamic soft limiter were not used to limit the incoming signal or the band pass filtered signal, the output signal on line 219 would tend to contain severe ringing and overshoot, which also increases the likelihood of an erroneous detection of an ANSam signal.

Continuing to refer to FIG. 4, an ANS detector (or first frequency component detector) 205 receives as input signals the incoming signal, on line 223 (from line 203), and the band pass filtered signal, on line 209. In the preferred embodiment, the ANS (or first frequency) detector 205 is implemented as a comparator, having threshold based detection. The ANS detector compares the average magnitude or power levels of the input signals on lines 223 and 209, and if the average magnitude or power levels are approximately the same, then a first frequency component is present in the incoming signal, such as the 2100 Hz component of the ANS and ANSam signals. If such a first frequency component has been detected, the ANS detector 205 provides an enable signal on line 221 to an ANSam (or second frequency) detector 206, because if no 2100 Hz signal is present, a positive detection of an ANSam signal would indicate an erroneous detection.

Also referring to FIG. 4, the output signal appearing on line 219 is applied or input to the ANSam detector (or second frequency component detector) 206. The ANSam detector 206 has a second input from line 209, the band pass filtered signal output from the first band pass filter 204. In the preferred embodiment, the ANSam detector is also implemented as a comparator, and has an enable signal input on line 221 from the ANSam detector. The ANSam detector compares the filtered limited signal average power level (from line 219) with the first band pass filtered signal average power level from line 209. If a second frequency component is present in the incoming signal, then a significant power level should be present on both inputs, in a ratio corresponding to the modulation index. For example, with an ANSam signal having a 15 Hz modulating component at a 20% index, a five to one ratio may be expected of the average power level of the band pass filtered signal compared to the average power level of the filtered limited signal (which should only have significant power from the second frequency component).

If the result of the ANSam (or second frequency) detection is negative, but the result of the ANS (or first frequency) detection is positive, then the incoming signal had a first frequency component but not a second frequency component, e.g., the incoming signal was an ANS signal and not an ANSam signal. If the result of both the ANSam and ANS detections were positive, then the incoming signal had both first and second frequency components, e.g., the incoming signal was an ANSam signal. All other combinations of results are negative detections.

In summary, as shown in FIGS. 2–6, an embodiment of the present invention may include an apparatus for detecting an amplitude modulated signal in the presence of impulse distortions, in which the amplitude modulated signal is transmitted and received via a channel, the amplitude modulated signal has a first frequency component, and the amplitude modulated signal has an amplitude modulated signal average power level. The apparatus embodiment then comprises: first, a first band pass filter 204 (FIG. 4), the first band pass filter having a first center frequency corresponding to the first frequency component to filter the amplitude modulated signal to form a first band pass filtered signal, the first band pass filtered signal having a first band pass filtered signal average power level and further having impulse, amplitude or other distortions corresponding to an occurrence of impulse distortions (or phase reversals) in the amplitude modulated signal (FIG. 5B); second, a limiter 208 (FIG. 4) coupled to the first band pass filter to limit the amplitude distortions of the first band pass filtered signal to a limit threshold to form a limited signal; third, a rectifier 215 (FIG. 4) coupled to the limiter to rectify the limited signal to form a rectified, limited signal; fourth, a second band pass filter 217 (FIG. 4) coupled to the rectifier, the second band pass filter having a second center frequency corresponding to a second frequency component to filter the rectified, limited signal to form a filtered limited signal, the filtered limited signal having a filtered limited signal average power level; fifth, a first comparator (such as ANS detector 205, FIG. 4) to detect the presence of the first frequency component by comparing the amplitude modulated signal average power level to the first band pass filtered signal average power level; and sixth, a second comparator (such as ANSam detector 206, FIG. 4) to detect the presence of a second frequency component, if any, by comparing the filtered limited signal average power level to the first band pass filtered signal average power level.

As shown in FIG. 2, the apparatus may be implemented using a digital signal processor, and as shown in FIG. 3, the apparatus may be implemented using a processor. Also as shown in FIG. 6, the dynamic soft limiter 208 may further comprise: first, a rectifier 209 to rectify the first band pass filtered signal to form a rectified first band pass filtered signal; second, a low pass filter 210 coupled to the rectifier to filter the rectified first band pass filtered signal to form a low pass signal, the low pass signal having a low frequency average magnitude level; and third, a threshold detector 211 to determine the limit threshold as a predetermined variance from the low frequency average magnitude level.

As shown in FIG. 3, another embodiment of the invention may include a data communication device 101 for data transmission and reception, the data communication device having an initial training period for detecting an answer back tone signal and for detecting an amplitude modulated answer back tone signal. In the various embodiments, both the answer back tone signal and the amplitude modulated answer back tone signal are transmitted via a channel, the answer back tone signal has a first frequency component containing phase reversals, and the amplitude modulated answer back tone signal has the first frequency component containing phase reversals and also has a second frequency component, with the answer back tone signal having an answer back tone signal average power level, and with the amplitude modulated answer back tone signal having an amplitude modulated answer back tone signal average power level. The data communication device may then comprise: first, a data access arrangement 104 coupleable to a channel to receive a signal; second, an A/D converter 110 (or, equivalently, a coder-decoder) coupled to the data access arrangement to sample the signal; and third, a processor 108 coupled to the A/D converter to receive the sampled signal, the processor responsive to band pass filter the amplitude modulated signal at a first center frequency corresponding to the first frequency component, to form a band pass filtered signal, the band pass filtered signal having a band pass filtered signal average power level and further having impulse distortions corresponding to an occurrence of phase reversals in the signal; the processor further responsive to limit the impulse distortions of the band pass filtered signal to a limit threshold, to form a limited signal; the processor further responsive to rectify and band pass filter the limited signal at a second center frequency corresponding to the second frequency component, to determine a limited signal average power level; the processor further responsive to compare the answer back tone signal average power level to the band pass filtered signal average power level to determine the presence of the first frequency component; and the processor further responsive to compare the limited signal average power level to the band pass filtered signal average power level to determine the presence of the second frequency component. In addition, the processor 108 may be further responsive to rectify and low pass filter the band pass filtered signal to determine a low frequency average magnitude level, and to determine the limit threshold as a predetermined variance from the low frequency average magnitude level.

Another embodiment of the present invention may include the dynamic soft limiter 208. In this embodiment, the apparatus dynamically limits impulse distortions in an amplitude modulated signal. The dynamic soft limiter or other apparatus consists of, first, a rectifier 209 to rectify the amplitude modulated signal to form a rectified signal, and second, a low pass filter 210 coupled to the rectifier to filter the rectified signal to form a rectified, low pass filtered signal, the rectified, low pass filtered signal having a low frequency average magnitude level. Third, the dynamic soft limiter has a threshold selector 211 coupled to the low pass filter, the threshold selector responsive to the low frequency average magnitude level to form a threshold limit signal; and fourth, a limiter 212 for receiving the amplitude modulated signal, the limiter further coupled to the threshold selector to receive the threshold limit signal, the limiter dynamically limiting the impulse distortions of the amplitude modulating signal to a magnitude determined by the threshold limit signal, to form a limited signal. Other features of the dynamic soft limiter may include the low pass filter having a cut-off frequency equal to or less than 15 Hz; the limiter dynamically limiting the impulse distortions to 25% above the low frequency average magnitude level; and dynamically limiting an am signal in which the impulse distortions are caused by the phase reversals of an ANS-type signal.

Figure 7:
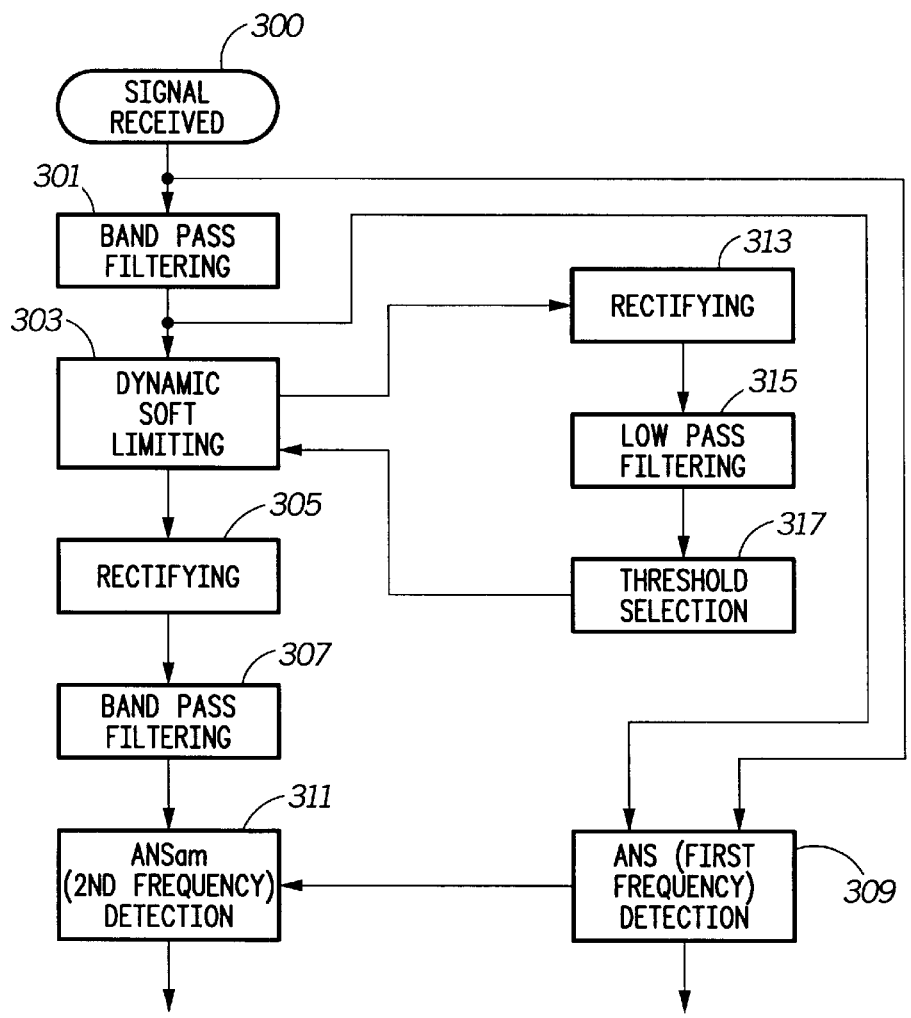
FIG. 7 is a flow diagram illustrating the method embodiment of the present invention.

FIG. 7 is a flow diagram illustrating the method embodiment of the present invention. As in the various apparatus embodiments, the method embodiment may be programmed into a digital signal processor (such as DSP 106, FIG. 4) or a processor (such as processor 108, FIG. 3). Referring to FIG. 7, the method embodiment consists of a method for detecting an amplitude modulated signal in the presence of impulse distortions, in which the amplitude modulated signal is transmitted and received via a channel, and in which the amplitude modulated signal has a first frequency component and has a first average power level. As shown in FIG. 7, the method then begins with the received signal in starting step 300 and proceeds to step 301, band pass filtering the amplitude modulated signal at a first center frequency corresponding to the first frequency component, to form a band pass filtered signal, in which the band pass filtered signal has a first band pass filtered signal average power level and further has impulse distortions corresponding to an occurrence of phase reversals in the amplitude modulated signal. Next, in step 303, the method limits the impulse distortions of the band pass filtered signal to a limit threshold, to form a limited signal. In steps 305 and 307, the method rectifies and band pass filters the limited signal at a second center frequency corresponding to a second frequency component, to determine a filtered limited signal average power level. In step 309, the method compares the first average power level of the amplitude modulated signal to the first band pass filtered signal average power level of the band pass filtered signal to determine the presence of the first frequency component. Lastly, in step 31 1, the method compares the filtered limited signal average power level to the first band pass filtered signal average power level to determine the presence of the second frequency component.

Corresponding to the apparatus embodiments, the limiting step 303 may also include, in steps 313 and 315, rectifying and low pass filtering the band pass filtered signal to determine a low frequency average magnitude level; and in step 317, determining the limit threshold as a predetermined variance from the low frequency average magnitude level.

A major and significant advantage of a modem with such amplitude modulation detection, in accordance with the present invention, is the reduced effects of impulse responses on the AM detection circuitry. Prior art methods and apparatus typically have only been able to detect and discriminate an ANSam signal at a minimum of −30 dBm and at a signal to noise ratio of 20 dB. In the prior art, the phase reversals of the ANS and ANSam signals tend to cause severe impulses to the 15 Hz BPF (or detector) which would then resonate due to the narrow bandwidths required for proper detection, causing false positive detections of a non-existent ANSam signal. The present invention also provides superior detection and discrimination of the 15 Hz component of the incoming signal, which is typically difficult to detect and discriminate in the prior art due to impulse distortions occurring with a frequency of the same order of magnitude as the settling time of most narrow band, 15 Hz band pass filters. With the various apparatus embodiments of the present invention, detection and proper discrimination of an ANSam signal has occurred at receive power levels as low as approximately −50 dBm and with a signal to noise ratio as poor as 4 dB on a worst case transmission line or channel.

Another significant advantage of the present invention is its applicability to a wide range of technologies and circumstances involving the occurrence of impulse distortions, in addition to the detection of ANS and ANSam signals. For example, various cable environments, such as cable television environments, are subject to significant impulse noise from switching and static. Impulse noise in any communication channel is also caused in the environment generally, and may also occur from such local activities as automobile ignition and microwave generation.

Other significant advantages of the present invention may also be apparent. The present invention provides significantly improved response time, superior noise rejection, and superior discrimination of amplitude modulated signals subject to impulse distortions. In addition, the various embodiments may be implemented, such as in a digital signal processor, in a manner which requires comparatively little memory and which utilizes comparatively little processing time.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims. The invention is further defined by the following claims.

We claim:

1. A method for detecting an amplitude modulated signal in the presence of impulse distortions, the amplitude modulated signal transmitted and received via a channel, the amplitude modulated signal having a first frequency component, the amplitude modulated signal having a first average power level, the method comprising:

(a) band pass filtering the amplitude modulated signal at a first center frequency corresponding to the first frequency component, to form a band pass filtered signal, the band pass filtered signal having a first band pass filtered signal average power level and further having distortions corresponding to an occurrence of impulse distortions in the amplitude modulated signal;

(b) limiting the distortions of the band pass filtered signal to a limit threshold, to form a limited signal;

(c) rectifying and band pass filtering the limited signal at a second center frequency corresponding to a second frequency component, to determine a filtered limited signal average power level;

(d) comparing the first average power level of the amplitude modulated signal to the first band pass filtered signal average power level of the band pass filtered signal to determine the presence of the first frequency component; and (e) comparing the filtered limited signal average power level to the first band pass filtered signal average power level of the band pass filtered signal to determine the presence of the second frequency component.

2. The method of claim 1, wherein the limiting step (b) further comprises:
   (b1) rectifying and low pass filtering the band pass filtered signal to determine a low frequency average magnitude level; and
   (b2) determining the limit threshold as a predetermined variance from the low frequency average magnitude level.

3. The method of claim 2, wherein the predetermined variance is within a dynamic range of 25% above the low frequency average magnitude level.

4. The method of claim 1, further comprising:
   (f) detecting the presence of the first frequency component and the second frequency component throughout a dynamic range of power levels of the amplitude modulated signal extending from 0 dBm to −43 dBm.

5. The method of claim 1, wherein the amplitude modulated signal is an amplitude modulated answer back signal.

6. The method of claim 5, wherein the first center frequency of the band pass filtering is 2100 Hz.

7. The method of claim 5, wherein the second center frequency of the band pass filtering is 15 Hz.

8. The method of claim 5, wherein the impulse distortions are from phase reversals of the amplitude modulated signal.

9. The method of claim 1, wherein the amplitude modulated signal is an answer back signal.

10. An apparatus for detecting an amplitude modulated signal in the presence of impulse distortions, the amplitude modulated signal transmitted and received via a channel, the amplitude modulated signal having a first frequency component, the amplitude modulated signal having an amplitude modulated signal average power level, the apparatus comprising:
   a first band pass filter, the first band pass filter having a first center frequency corresponding to the first frequency component to filter the amplitude modulated signal to form a first band pass filtered signal, the first band pass filtered signal having a first band pass filtered signal average power level and further having distortions corresponding to an occurrence of impulse distortions in the amplitude modulated signal;
   a limiter coupled to the first band pass filter to limit the distortions of the first band pass filtered signal to a limit threshold to form a limited signal;
   a rectifier coupled to the limiter rectify the limited signal to form a rectified, limited signal;
   a second band pass filter coupled to the rectifier, the second band pass filter having a second center frequency corresponding to a second frequency component to filter the rectified, limited signal to form a filtered limited signal, the filtered limited signal having a filtered limited signal average power level;
   a first comparator to detect the presence of the first frequency component by comparing the amplitude modulated signal average power level to the first band pass filtered signal average power level; and
   a second comparator to detect the presence of the second frequency component by comparing the filtered limited signal average power level to the first band pass filtered signal average power level.

11. The apparatus of claim 10, wherein the apparatus is implemented using a digital signal processor.

12. The apparatus of claim 10, wherein the apparatus is implemented using a processor.

13. The apparatus of claim 10, wherein the limiter further comprises:
   a rectifier to rectify the first band pass filtered signal to form a rectified first band pass filtered signal;
   a low pass filter coupled to the rectier to filter the rectified first band pass filtered signal to form a low pass signal, the low pass signal having a low frequency average magnitude level; and
   a threshold detector to determine the limit threshold as a predetermined variance from the low frequency average magnitude level.

14. The apparatus of claim 13, wherein the predetermined variance is within a dynamic range of 25% above the low frequency average magnitude level.

15. The apparatus of claim 10, wherein the amplitude modulated signal is an amplitude modulated answer back signal.

16. The apparatus of claim 10, wherein the first center frequency of the first band pass filter is 2100 Hz.

17. The apparatus of claim 10, wherein the second center frequency of the second band pass filter is 15 Hz.

18. The apparatus of claim 10, wherein the amplitude modulated signal is an answer back signal.

19. A data communication device for data transmission and reception, the data communication device having an initial training period for detecting an answer back tone signal and for detecting an sampled answer back tone signal, both the answer back tone signal and the amplitude modulated answer back tone signal transmitted via a channel, the answer back tone signal having a first frequency component containing phase reversals, the amplitude modulated answer back tone signal having the first frequency component containing phase reversals and having a second frequency component, the answer back tone signal having an answer back tone signal average power level, and the amplitude modulated answer back tone signal having an amplitude modulated answer back tone signal average power level, the data communication device comprising:
   a data access arrangement coupleable to a channel to receive a signal;
   an analog-digital converter coupled to the data access arrangement to sample the signal, to form a sampled signal; and
   a processor coupled to the analog-digital converter to receive the sampled signal, the processor responsive to band pass filter the amplitude modulated signal at a first center frequency corresponding to the first frequency component, to form a band pass filtered signal, the band pass filtered signal having a band pass filtered signal average power level and further having impulse distortions corresponding to an occurrence of phase reversals in the signal; the processor further responsive to limit the impulse distortions of the band pass filtered signal to a limit threshold, to form a limited signal; the processor further responsive to rectify and band pass filter the limited signal at a second center frequency corresponding to the second frequency component, to determine a limited signal average power level; the processor further responsive to compare the answer back tone signal average power level to the band pass filtered signal average power level to determine the presence of the first frequency component; and the processor further responsive to compare the limited signal average power level to the band pass filtered signal average power level to determine the presence of the second frequency component.

20. The data communication device of claim 19, wherein the processor is further responsive to rectify and low pass filter the band pass filtered signal to determine a low frequency average magnitude level, and to determine the limit threshold as a predetermined variance from the low frequency average magnitude level.

21. The data communication device of claim 20, wherein the predetermined variance is within a dynamic range of 25% above the low frequency average magnitude level.

22. The data communication device of claim 19, wherein the processor is further responsive to detect the presence of the first frequency component and the second frequency component throughout a dynamic range of power levels of the signal extending from 0 dBm to −43 dBm.

23. The data communication device of claim 19, wherein the signal is an amplitude modulated answer back signal.

24. The data communication device of claim 19 wherein the first center frequency of the band pass filtering is 2100 Hz.

25. The data communication device of claim 19 wherein the second center frequency of the band pass filtering is 15 Hz.

26. The data communication device of claim 19 wherein the signal is an answer back signal.

27. An apparatus for dynamically limiting impulse distortions in an amplitude modulated signal, the apparatus comprising:

a rectifier to rectify the amplitude modulated signal to form a rectified signal;

a low pass filter coupled to the rectifier to filter the rectified signal to form a rectified, low pass filtered signal, the rectified, low pass filtered signal having a low frequency average magnitude level;

a threshold selector coupled to the low pass filter, the threshold selector responsive to the low frequency average magnitude level to form a threshold limit signal; and a limiter for receiving the amplitude modulated signal, the limiter further coupled to the threshold selector to receive the threshold limit signal, the limiter dynamically limiting the impulse distortions of the amplitude modulating signal to a magnitude determined by the threshold limit signal, to form a limited signal.

28. The apparatus of claim 27 wherein the low pass filter has a cut-off frequency equal to or less than 15 Hz.

29. The apparatus of claim 27 wherein the limiter dynamically limits the impulse distortions to 25% above the low frequency average magnitude level.

30. The apparatus of claim 27 wherein the impulse distortions are caused by a plurality of phase reversals an ANS-type signal.

* * * * *